(12) United States Patent
Geyik et al.

(10) Patent No.: US 10,840,196 B1
(45) Date of Patent: Nov. 17, 2020

(54) TRACE MODULATIONS IN CONNECTORS FOR INTEGRATED-CIRCUIT PACKAGES

(71) Applicant: Intel Corporation, Santa Clara, CA (US)

(72) Inventors: Cemil Geyik, Chandler, AZ (US); Zhiguo Qian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/582,816

(22) Filed: Sep. 25, 2019

(51) Int. Cl.
| | |
|---|---|
| *H05K 1/02* | (2006.01) |
| *H01L 23/64* | (2006.01) |
| *H01L 23/498* | (2006.01) |
| *H05K 1/11* | (2006.01) |

(52) U.S. Cl.
CPC ........ *H01L 23/64* (2013.01); *H01L 23/49838* (2013.01); *H05K 1/0218* (2013.01); *H05K 1/0242* (2013.01); *H05K 1/111* (2013.01); *H05K 2201/09227* (2013.01); *H05K 2201/09372* (2013.01)

(58) Field of Classification Search
CPC ... H05K 1/0242; H05K 1/0265; H05K 1/0271
See application file for complete search history.

(56) References Cited

U.S. PATENT DOCUMENTS

2008/0290510 A1* 11/2008 Audet ............... H01L 23/49811
257/737

* cited by examiner

*Primary Examiner* — Jeremy C Norris
(74) *Attorney, Agent, or Firm* — Schwegman Lundberg & Woessner, P.A.

(57) ABSTRACT

Disclosed embodiments include a signal trace in an integrated-circuit device package substrate. Portions of the signal traces, suspend a landing pad in a recess, and a portion of the suspended signal trace is form-factor modulated that is different in cross-section area than other portions of the suspended signal trace.

16 Claims, 8 Drawing Sheets

TRACE MODULATIONS IN CONNECTORS FOR INTEGRATED-CIRCUIT PACKAGES

FIELD

This disclosure relates to connector signal speed as modulated by trace form factors.

BACKGROUND

High-speed digital signals encounter speed-improvement obstacles during integrated-circuit chip miniaturization, where the chip becomes smaller, while the digital speed requirements are becoming larger.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Disclosed embodiments include high-speed signal examples within modulated signal-trace configurations for integrated-circuit wiring within packages and wiring boards. Channel bandwidth embodiments include trace form-factor modulation where a running trace approaches a landing pad. Ground-stitching vias are used to shield the landing pad and the form-factor of the modulated trace. The form-factor modulated trace extends, cantilever fashion, over a recess in package material that houses the landing pad, which is also suspended over the recess by the form-factor modulated trace. Capacitance and inductance are affected by design of the form-factor modulated trace.

In an embodiment, the width of a signal trace is modulated as it extends into the recess, while the Z-height remains the same as the same. In an embodiment, the Z-height of a signal trace is modulated while the X-Y width remains the same. In an embodiment, both the Z-height of a signal trace and the X-Y width are modulated.

Figure 1:
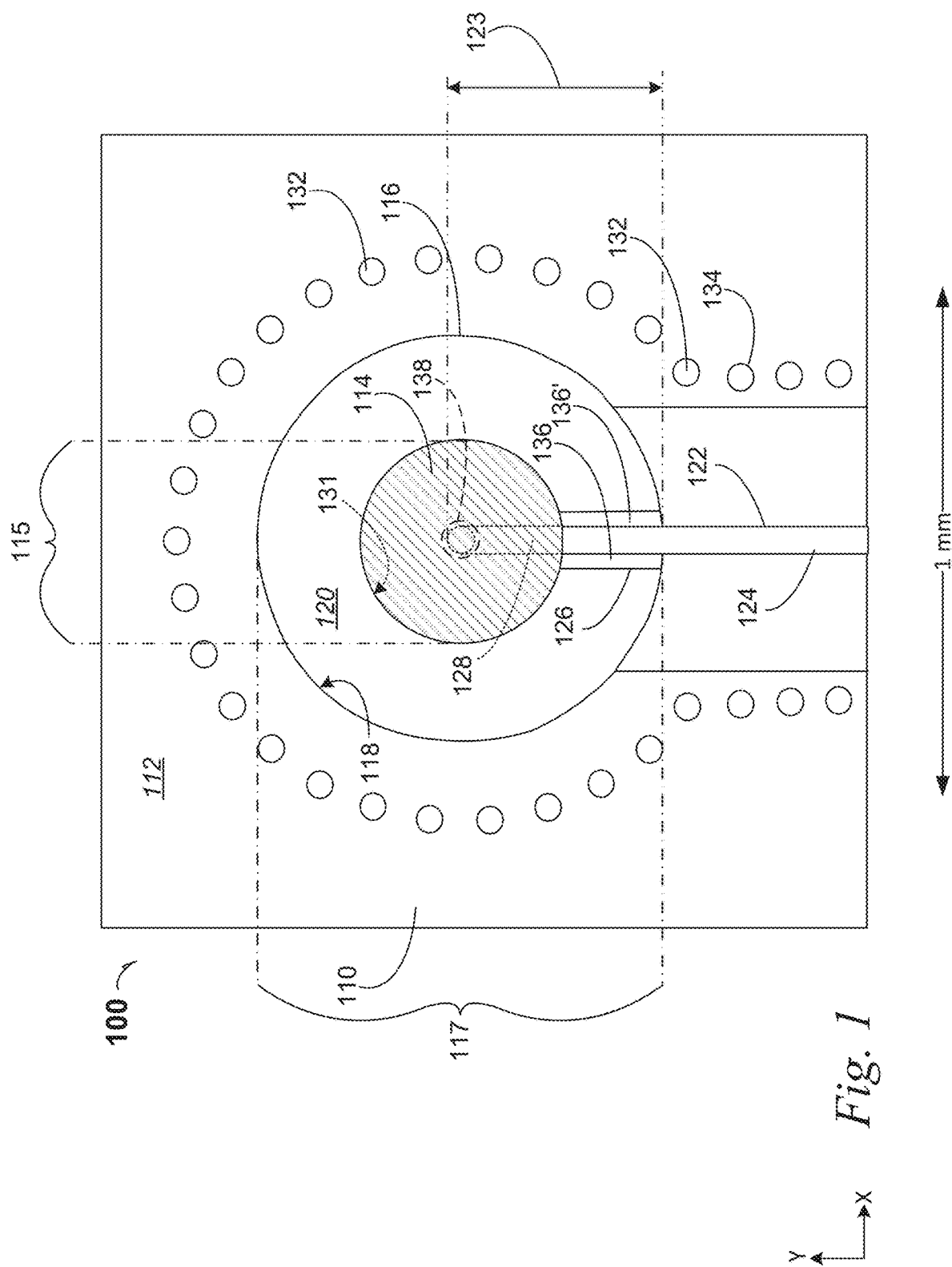
FIG. 1 is a top plan of a portion of an integrated-circuit package substrate according to an embodiment.

FIG. 1 is a top plan 100 of a portion of an integrated-circuit package substrate 110 according to an embodiment. The integrated-circuit package substrate 110 has a die side 112 and a landing pad 114 that is extending over a recess 116 that opens the die side 112. The recess 116 may also be referred to as a void 116.

The recess 116 has a wall 118 and a floor 120. As illustrated, the recess wall 118 is orthogonal to the figure. As illustrated, the recess 116 has a characteristic dimension of a diameter 117. Further, the recess 116 has a characteristic form factor as defined by the height of the wall 118 as a ratio of the diameter 117. A 1 millimeter (1 mm) length is provided for reference in an embodiment.

Similarly, the landing pad 114 has a characteristic dimension of a diameter 115 and a characteristic form factor of the diameter 115 and a Z-height 113 (see FIG. 2) or thickness.

In an embodiment, the landing pad 114 is suspended by a signal trace 122 that includes a trace first portion 124, a modulated trace second portion 126, and a trace subsequent portion 128. The cantilevered portion of the trace 122 has an effective cantilever length 123 with the modulated trace second portion 126 and the trace subsequent portion 128 being suspended within the recess 116. In an embodiment, the recess 116 is a void with a cantilever structure that includes the trace 122, modulated second portion 126, and trace subsequent portion 128. In an embodiment, the recess 116 is termed a "void' but the recess 116 is filled with dielectric materials of the integrated-circuit package substrate 110. The term "void" in this embodiment, refers to no electrically conductive materials below the structures including the trace 122, modulated second portion 126, and trace subsequent portion 128, as well as the landing pad 114.

The trace first portion 124 is directly supported by dielectric materials of the integrated-circuit package substrate 110. Further, the modulated trace second portion 126 begins at or near the circumference of the wall 118, and ends at or near the edge of the landing pad 114. Further, the trace subsequent portion 128 is obscured by the landing pad 114. In an embodiment, the trace subsequent portion 128 has substantially the same cross section as the trace first portion 124, such that only the modulated trace second portion 126 has a different from factor from the respective trace first and subsequent portions 124 and 128.

In an embodiment where the trace first portion 124 has a width of unity, by comparison the modulated trace second portion 126 has a width (measured in the X-direction) of 2.7 times unity. In an embodiment where the trace first portion 124 has a width of unity, by comparison the modulated trace second portion 126 has a width (measured in the X-direction) of twice unity. In an embodiment, the modulated trace second portion 126 is made from a composite that includes a continuation of the trace first portion 124, and widening portions 136 and 136'. In an embodiment, an integral modulated trace second portion 126, 136 and 136' is made from a single deposition of trace material, such that grain structure is homogeneous at transition locations between the trace first portion 124 and the modulated trace second portion 126, and between the modulated trace second portion 126 and the trace subsequent portion 128. In an integrated-trace embodiment, formation of the trace 122 is done is a single deposition operation.

In an embodiment, the recess 116 is a first recess 116 and a subsequent recess 216 (see FIG. 2) opens the floor 120 of the first recess 116. The subsequent recess 216 is obscured by the landing pad 114 such that the subsequent recess 216 is completely or at least partially overshadowed by the landing pad 114. As illustrated in an embodiment, a subsequent recess wall 131 is delineated by about the external circumference of the landing pad 114.

In an embodiment, ground-stitching structures 132 at least partially encircle the landing-pad recess 116, and the several landing-pad encircling ground-stitching structures 132 are embedded in material of the integrated-circuit package substrate 110. Additionally, trace-aligning ground-stitching structures 134 follow the rectangular form factor of the trace first portion 124, before it transitions to the modulated trace second portion 126.

Figure 2:
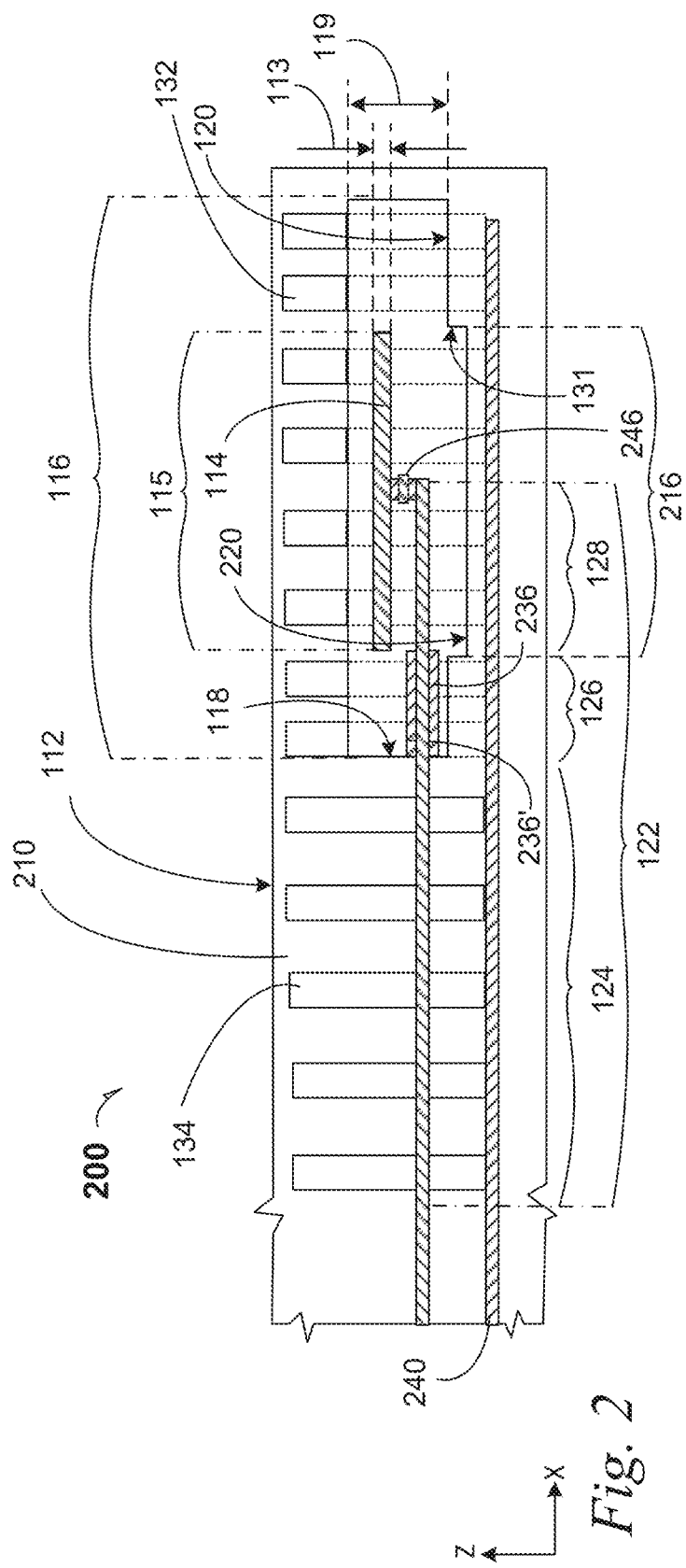
FIG. 2 is a cross-section elevation and partial projection of a portions of the integrated-circuit package substrate depicted in FIG. 1 according to an embodiment.

FIG. 2 is a cross-section elevation and partial projection 200 of a portions of an integrated-circuit package substrate 210 that may be identical to the integrated-circuit package substrate 110 depicted in FIG. 1 according to an embodiment. In an embodiment, some structures in the integrated-circuit package substrate 210 have variations as illustrated in FIG. 2.

The integrated-circuit package substrate 210 includes the die side 112 and the landing pad 114 that is extending over the recess 116. The recess 116 exhibits the wall 118 and the floor 120. As illustrated, the recess wall 118, although a circular structure, is orthogonal to the figure in the cross-section view. As illustrated, the recess 116 has the characteristic dimension of the diameter 117 (see FIG. 1). Further, the recess 116 has a characteristic form factor as defined by the height 119 of the wall 118 as a ratio of the diameter 117. Although the die side 112 is higher than the height 119 of the wall 118 in the illustration, in an embodiment, the Z-location of the die side 112 and the of the height 119 of the wall 118 are substantially the same. Deviations from these being substantially the same, depend upon give useful embodiments, such as a recessed landing pad 114 below the die-side 112 surface.

Similarly, the landing pad 114 has the characteristic dimension of the diameter 115 and a characteristic form factor of the diameter 115 and a Z-height 113 or thickness.

In an embodiment, the landing pad 114 is suspended by the trace 122, where the suspending structures include the modulated trace second portion 126, and the trace subsequent portion 128. In general in an embodiment, the structure may be referred to as a modulated-trace-suspended landing pad 114, where the trace portions 124, 126 and 128 comprise a modulated trace 122, and where the cavity 116 is open such that the modulated trace 122 suspends the landing pad 114. Consequently in several examples, modulated-trace-suspending landing pad embodiments are disclosed.

The trace 122 has an effective cantilever length 123 (see FIG. 1) with the modulated trace second portion 126 and the trace subsequent portion 128 being suspended within the cavity 116.

The trace first portion 124 is directly supported by dielectric materials of the integrated-circuit package substrate 110. Further, the modulated trace second portion 126 begins, when tracking in the X-direction, at or near the circumference of the wall 118, and ends at or near the edge of the landing pad 114. Further, the trace subsequent portion 128 is mostly directly below the landing pad 114. In an embodiment, the trace subsequent portion 128 has substantially the same cross section as the trace first portion 124, such that only the modulated trace second portion 126 has a different from factor from the respective trace first and subsequent portions 124 and 128.

In an embodiment, the modulated trace second portion 126 is as illustrated in FIG. 1.

In an embodiment where the trace first portion 124 has a width of unity, by comparison the modulated trace second portion 126 has a width of 2.7 times unity, as illustrated in FIG. 1. In an embodiment where the trace first portion 124 has a width of unity, by comparison the modulated trace second portion 126 has a width of twice unity.

In an embodiment, the modulated trace second portion 126 is made from a composite that includes a continuation of the trace first portion 124, and thickening portions 236 and 236' that are respectively above and below the continuation of the trace first portion 124. In other words, the modulated trace second portion 126 with the structures 236 and 236', are 2.7 times the cross-section of the trace first portion 124. An "over 236' and under 236" configuration is sometimes useful during fabrication of the integrated-circuit package substrate 210.

In an embodiment, the landing pad 114 is formed directly on the trace subsequent portion 128. In an embodiment, the trace subsequent portion 128 contacts a post portion 246 that is fabricated during one or several achieved during substrate assembly, such that the post portion 246 contacts both the landing pad 114 and the trace subsequent portion 128.

In an embodiment, the recess 116 is a first recess 116 and a subsequent recess 216 opens the floor 120 of the first recess 116 to a subsequent-recess floor 220. The subsequent recess 216 is below the landing pad 114 such that the subsequent recess 216 is overshadowed by the landing pad 114. As illustrated in an embodiment, a subsequent recess wall 131 is delineated by about the external circumference of the landing pad 114.

In an embodiment, the ground-stitching structures 132 encircle the landing-pad recess 116, and the several landing-pad encircling ground-stitching structures 132 are embedded in material of the integrated-circuit package substrate 110. Additionally, the trace-aligning ground-stitching structures 134 follow the rectangular form factor of the trace first portion 124, before it transitions to the modulated trace second portion 126.

In an embodiment, formation of the several ground-stitching vias 132 and 134, is done by opening contact corridors that stop at a Vss ground plane 240, followed by plating, using the ground plane 240 as a cathode. In an embodiment after forming of the several ground-stitching vias 132 and 134, the die side 112 is assembled, such that the several ground-stitching vias 132 and 134 are protected.

It may now be understood that the modulated trace second portion 126 may include both widening portions similar to items 136 and 136' as depicted in FIG. 1, and thickening portions 236 and 236' as depicted in FIG. 2, such that in an embodiment, the several structures in the modulated trace second portion are 2.7 times the cross-section of the trace first portion 124. In an embodiment, the modulated trace second portion 126 includes both widening portions similar to items 136 and 136' and both thickening portions 236 and 236', such that the several structures in the modulated trace second portion are the cross-section of the trace first portion 124.

Figure 3:
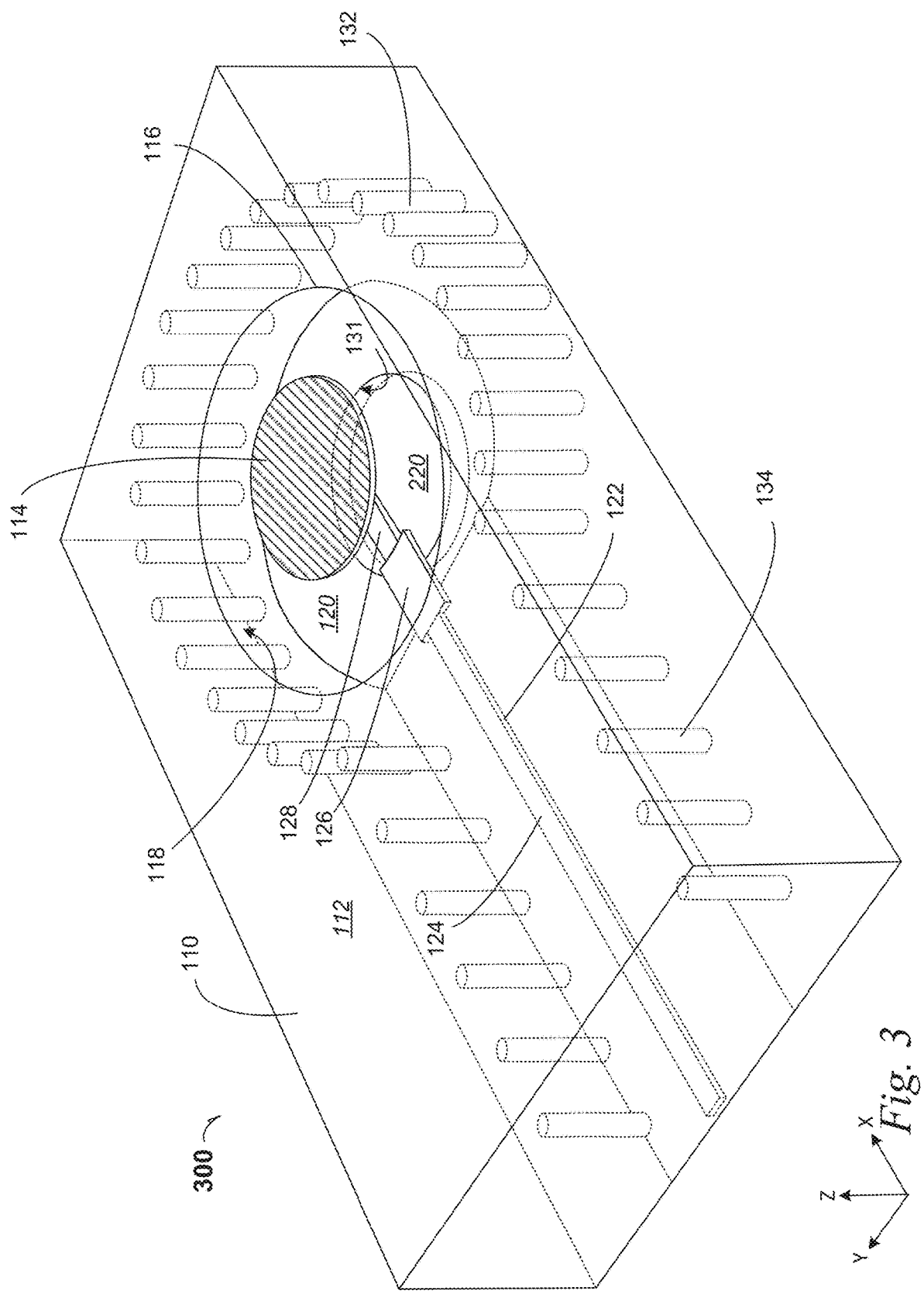
FIG. 3 is a perspective elevation of portions of the integrated-circuit package substrate depicted in FIGS. 1 and 2 according to several embodiments.

FIG. 3 is a perspective elevation 300 of selected portions of the integrated-circuit package substrate 110 depicted in FIGS. 1 and 2 according to several embodiments. The integrated-circuit package substrate 110 includes the die side 112 and the landing pad 114 that is extending over the recess 116 that opens the die side 112. The recess 116 exhibits the wall 118 and the floor 120. As illustrated, the recess 116 has the characteristic dimension of the diameter 117 (see FIG. 1). Further, the recess 116 has a characteristic form factor as defined by the height 119 (see FIG. 2) of the wall 118 as a ratio of the diameter 117.

Similarly, the landing pad 114 has the characteristic dimension of the diameter 115 (see FIG. 1) and a characteristic form factor of the diameter 115 and the Z-height 113 (see FIG. 2) or thickness.

As illustrated, the landing pad 114 is suspended by portions of the signal trace 122, particularly by the modulated trace second portion 126, and the trace subsequent portion 128.

The signal trace 122 has an effective cantilever length 123 (see FIG. 1) by combination of the modulated trace second portion 126 and the trace subsequent portion 128 being suspended within the cavity 116.

The trace first portion 124 is directly supported by dielectric materials of the integrated-circuit package substrate 110. Further, the trace second portion 126 begins, when tracking in the X-direction, at or near the circumference of the wall 118, and ends at or near the edge of the landing pad 114. Further, the trace subsequent portion 128 is mostly directly below the landing pad 114. In an embodiment, the trace subsequent portion 128 has substantially the same cross section as the trace first portion 124, such that only the modulated trace second portion 126 has a different cross sectional area and form factor from the respective trace first and subsequent portions 124 and 128.

In an embodiment, the modulated trace second portion 126 is a composite as illustrated in FIG. 1. In an embodiment where the trace first portion 124 has a width of unity, by comparison the modulated trace second portion 126 has a width of 2.7 times unity, as illustrated in FIG. 1. In an embodiment where the trace first portion 124 has a width of unity, by comparison the modulated trace second portion 126 has a width of twice unity.

In an embodiment, the ground-stitching structures 132 at least partially encircle the landing-pad recess 116, and the several landing-pad encircling ground-stitching structures 132 are embedded in material of the integrated-circuit package substrate 110. Additionally, the trace-aligning ground-stitching structures 134 follow the rectangular form factor of the trace first portion 124, before it transitions to the modulated trace second portion 126.

Figure 4:
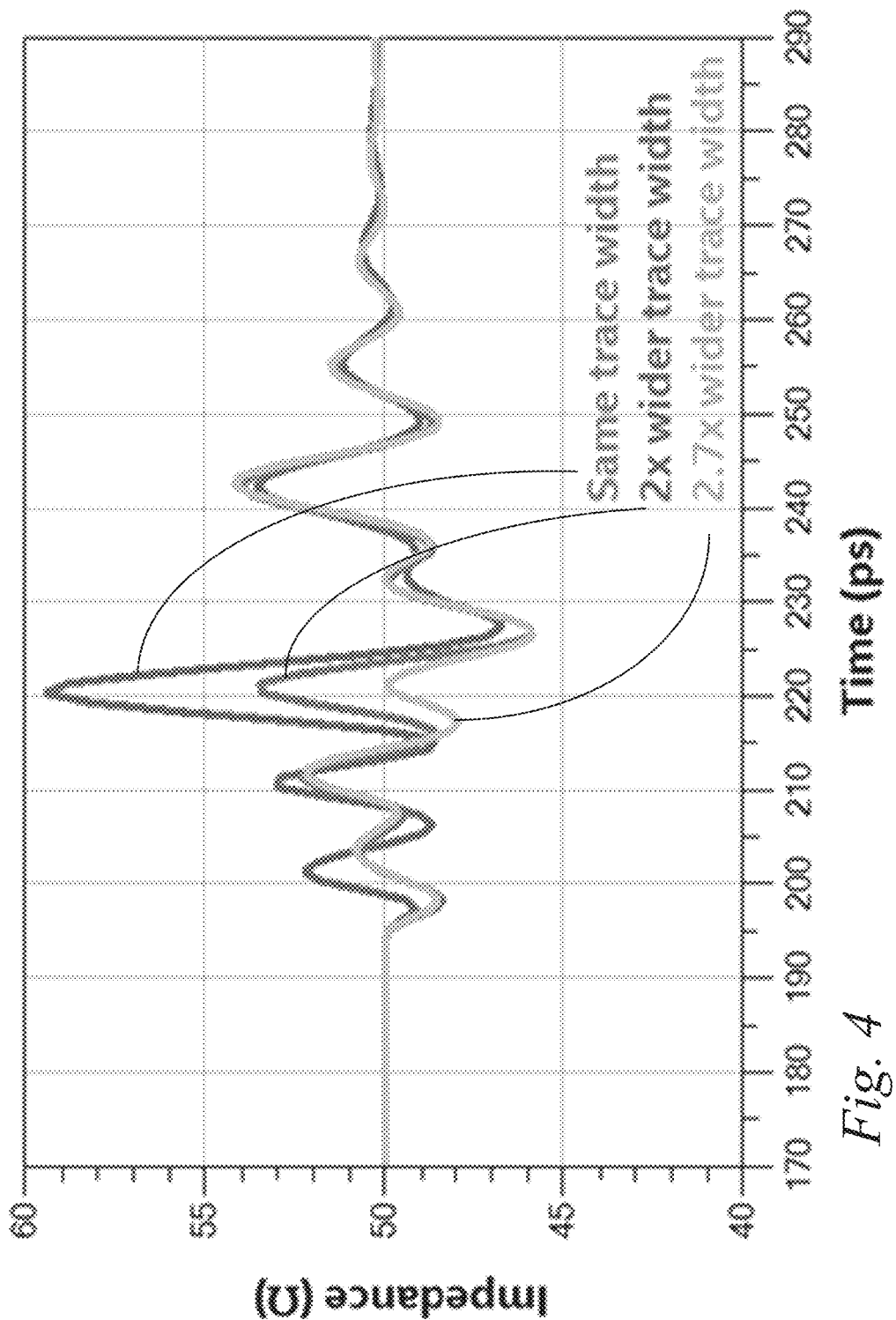
FIG. 4 is an illustration of an impedance profile, where voiding adjacent layers to the routing, reduces the capacitance of the signal trace according to several embodiments.

FIG. 4 is an illustration of an impedance profile, where voiding adjacent layers to the routing, reduces the capacitance of the signal trace according to several embodiments. Impedance discontinuity is improved by disclosed embodiments, where the modulated trace second portion has a wider form factor. In an embodiment, capacitance reduction is compensated by the modulated trace second portion. As illustrated where no trace modulation is used, by comparison about a 9 ohm impedance delta is achieved with the 2.7× width modulated second trace embodiment.

Figure 5:
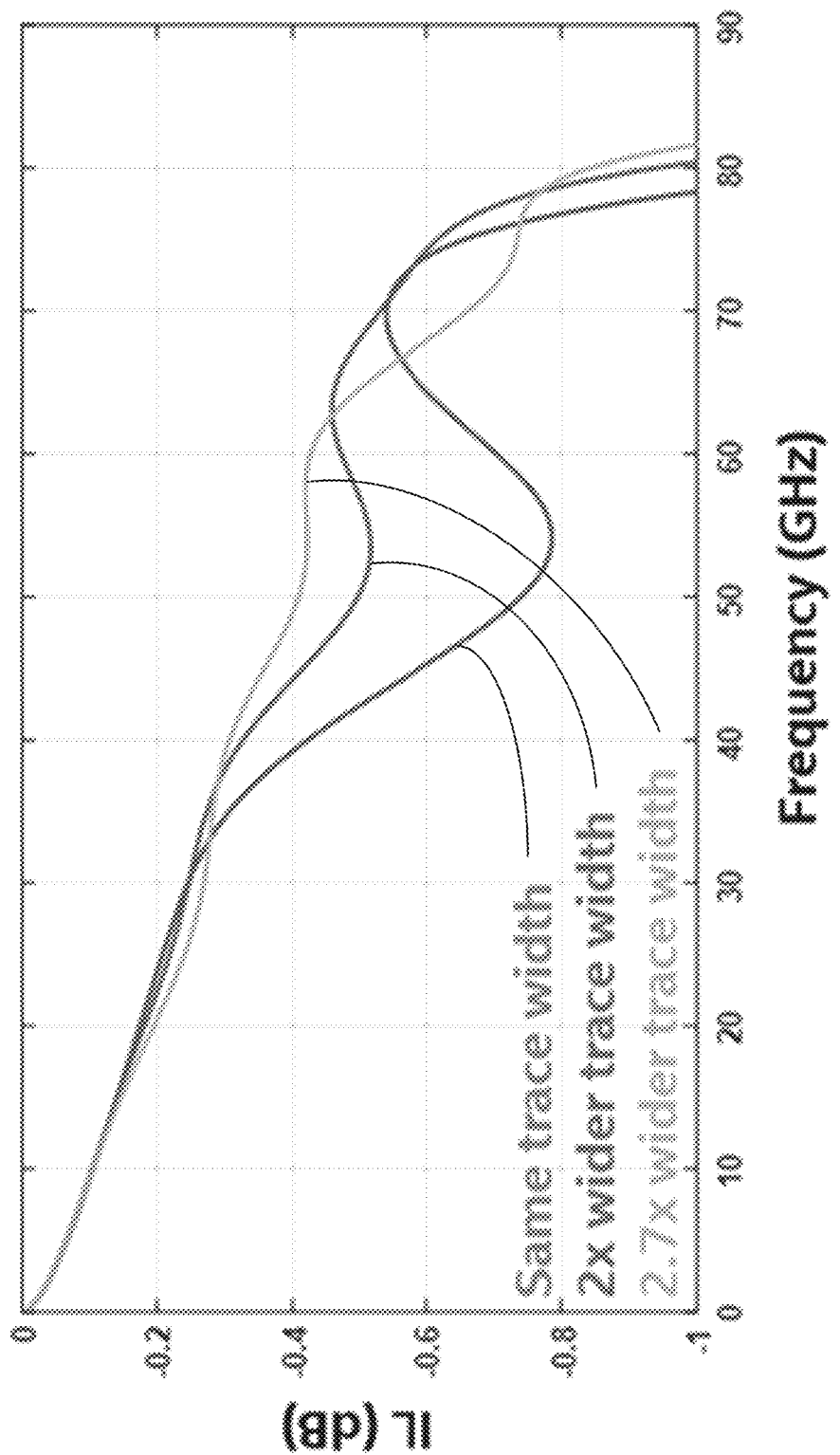
FIG. 5 is an illustration of an insertion loss profile, where voiding adjacent layers to the routing and beneath the landing pad, stabilizes the insertion loss according to several embodiments

FIG. 5 is an illustration of an insertion loss profile, where voiding adjacent layers to the routing and beneath the landing pad, stabilizes the insertion loss according to several embodiments. By contrast to using a 36 GHz bandwidth, disclosed embodiments enable a reduced loss dispersion, and a band with is exhibited at about 60 GHz, which supports a 225 Gbps signaling speed. As illustrated the 2× trace cross section modulation is also useful, to reduce the insertion-loss profile.

Figure 6:
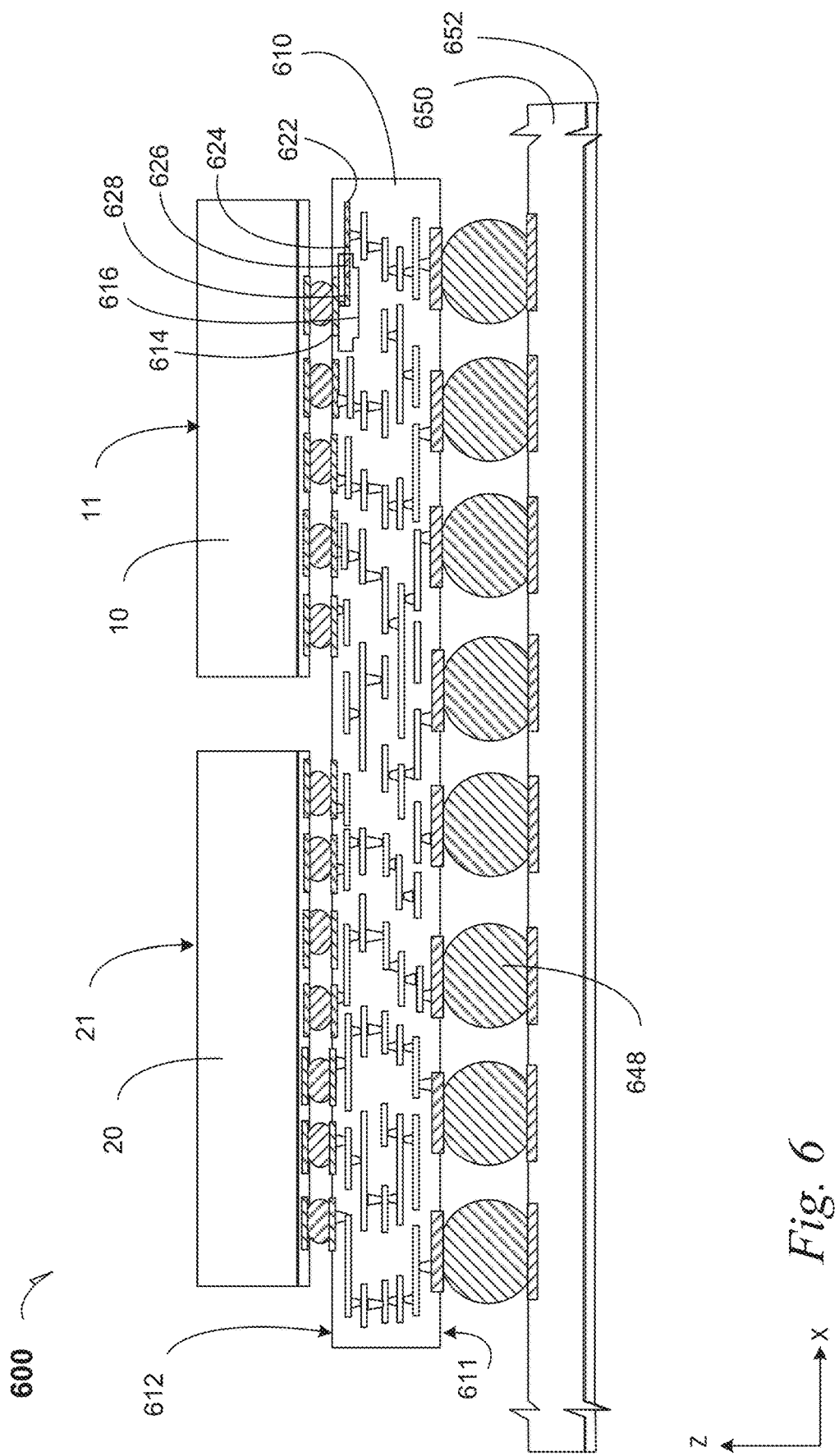
FIG. 6 is a cross-section elevation of an integrated-circuit apparatus that includes a modulated trace for a connector in an integrated-circuit package substrate according to an embodiment.

FIG. 6 is a cross-section elevation of an integrated-circuit apparatus 600 that includes a modulated trace for a connector in an integrated-circuit package substrate 610 according to an embodiment. A first integrated-circuit die 10 is mounted on the integrated-circuit package substrate 610 on a die side 612. Active devices and metallization in the first IC die 10 are flip-chip mounted at the die side 612, and an integrated-circuit die backside surface 11 is opposite the active devices and metallization. In an embodiment, a subsequent integrated-circuit die 20 is also mounted on the die side 612, to make a multi-chip module 600. Similarly for the subsequent integrated-circuit die, active devices and metallization in the subsequent IC die 20 are flip-chip mounted at the die side 612, and an integrated-circuit die backside surface 21 is opposite the active devices and metallization.

In an embodiment, a landing pad 614 is coupled to the first integrated-circuit device 10. The landing pad 614 is suspended by a signal trace 622 that includes a trace first portion 624, a modulated trace second portion 626, and a trace subsequent portion 628. The trace subsequent portion 628 has an effective cantilever length, added with the modulated trace second portion 626. Both the modulated trace second portion 626 and the trace subsequent portion 628 are suspended within the cavity 616. By use of the landing pad 614 with the modulated trace second portion 626 and the trace subsequent portion 628 within the cavity 616, a useful impedance profile similar to that depicted in FIG. 4, and a useful lowered insertion loss profile similar to that depicted in FIG. 5, is achieved by increasing the effective cross-section of the modulated trace second portion 626, to 2.7× that of the trace first portion 624 according to an embodiment. Similarly, by use of the landing pad 614 with the modulated trace second portion 626 and the trace subsequent portion 628 within the cavity 616, a useful impedance profile similar to that depicted in FIG. 4, and a useful lowered insertion loss profile similar to that depicted in FIG. 5, is achieved by increasing the effective cross-section of the modulated trace second portion 626, to twice that of the trace first portion 624 according to an embodiment.

In an embodiment, the integrated-circuit package substrate 610 is mounted at a land side 611 to a board 650, such as a mother board 650 by electrical bumps 648. In an embodiment, the board 650 has an external shell 652 that is an integral part of the board 650, and the external shell 652 acts as at least one of a physical and dielectric barrier to protect actives devices such as the first integrated-circuit die 10, as well as other active and passive devices that are encompassed within the external shell 652. In an embodiment, the external shell 652 is part of a hand-held computing system such as a communication device. In an embodiment, the external shell 652 is part of the exterior of a mobile computing platform such as a drone.

Figure 7:
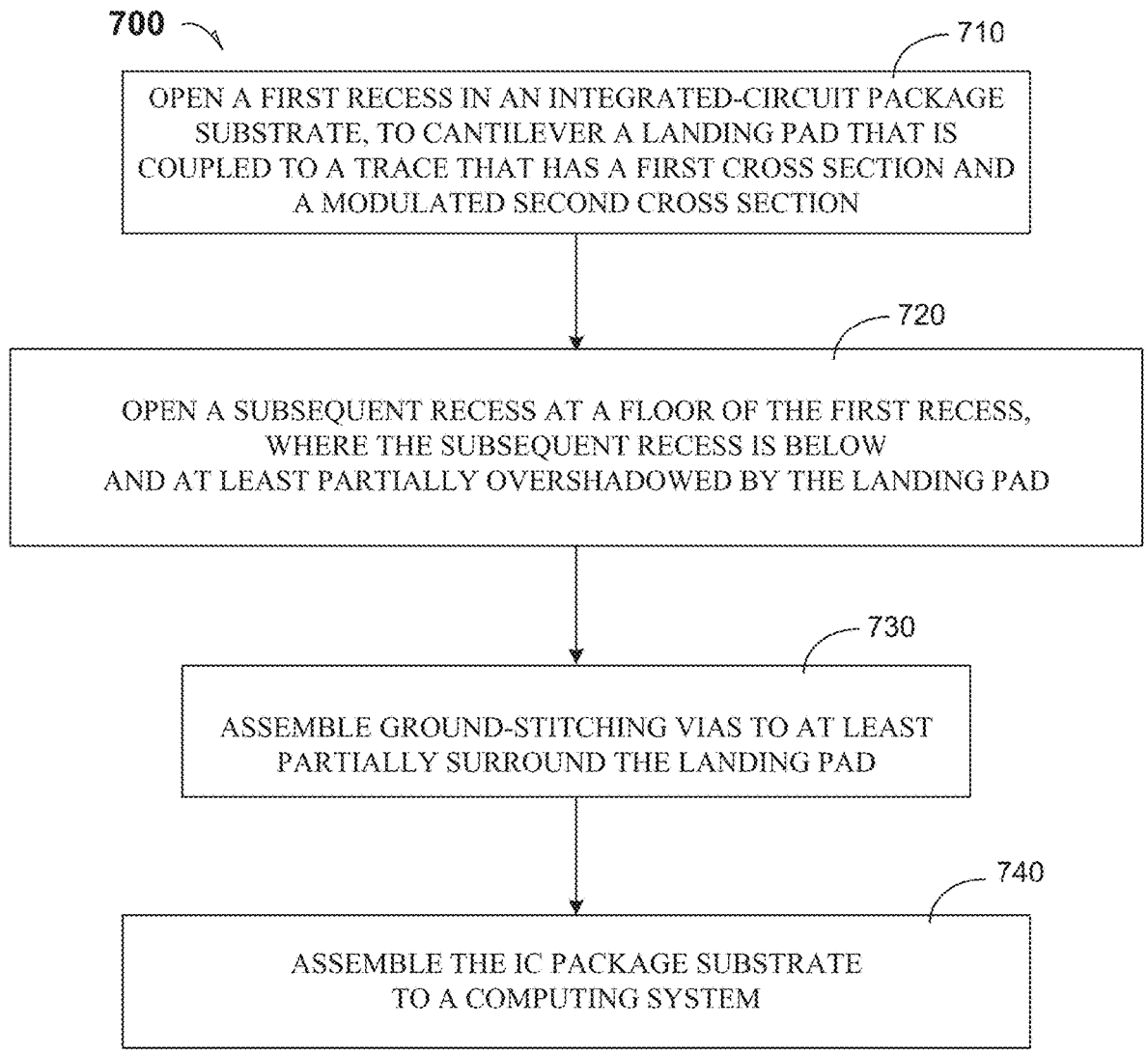
FIG. 7 is a process flow diagram for assembling an integrated-circuit apparatus that includes a modulated trace for a connector in an integrated-circuit package substrate according to an embodiment.

FIG. 7 is a process flow diagram for assembling an integrated-circuit apparatus that includes a signal trace with a modulated trace portion for a connector in an integrated-circuit package substrate according to an embodiment.

At 710, the process includes opening a first recess to cantilever a modulated trace second portion, a trace subsequent portion and a landing pad within the first recess. In an embodiment, photolithographic techniques, alter package material such that a wet etch removes material and opens the recess 116 to suspend the landing pad 114 as depicted in FIGS. 1, 2 and 3. In an embodiment, no wet etch is used and the "void" represents a recess 116 filled with non-metal dielectric materials, such as that supporting the trace first portion 124.

At 720, the process includes opening a subsequent recess that is below a landing pad, in the floor of a first recess. In an embodiment, the subsequent recess 216 is simultaneously formed with the first recess 116, also by photolithographic technique, followed by the wet etch. In an embodiment, no wet etch is used and the "void" represents a recess 116 filled with non-metal dielectric materials, such as that supporting the trace first portion 124.

At 730, the process includes assembling ground-stitching vias that surround at least a portion of a landing pad. In a non-limiting example embodiment, ground-stitching vias 132 are formed by etching contact corridors in the material of the integrated-circuit package substrate 110, followed by plating to the contact corridors, using a Vss ground plane 240.

At 740, the process includes assembling the integrated-circuit package substrate to a computing system.

Figure 8:
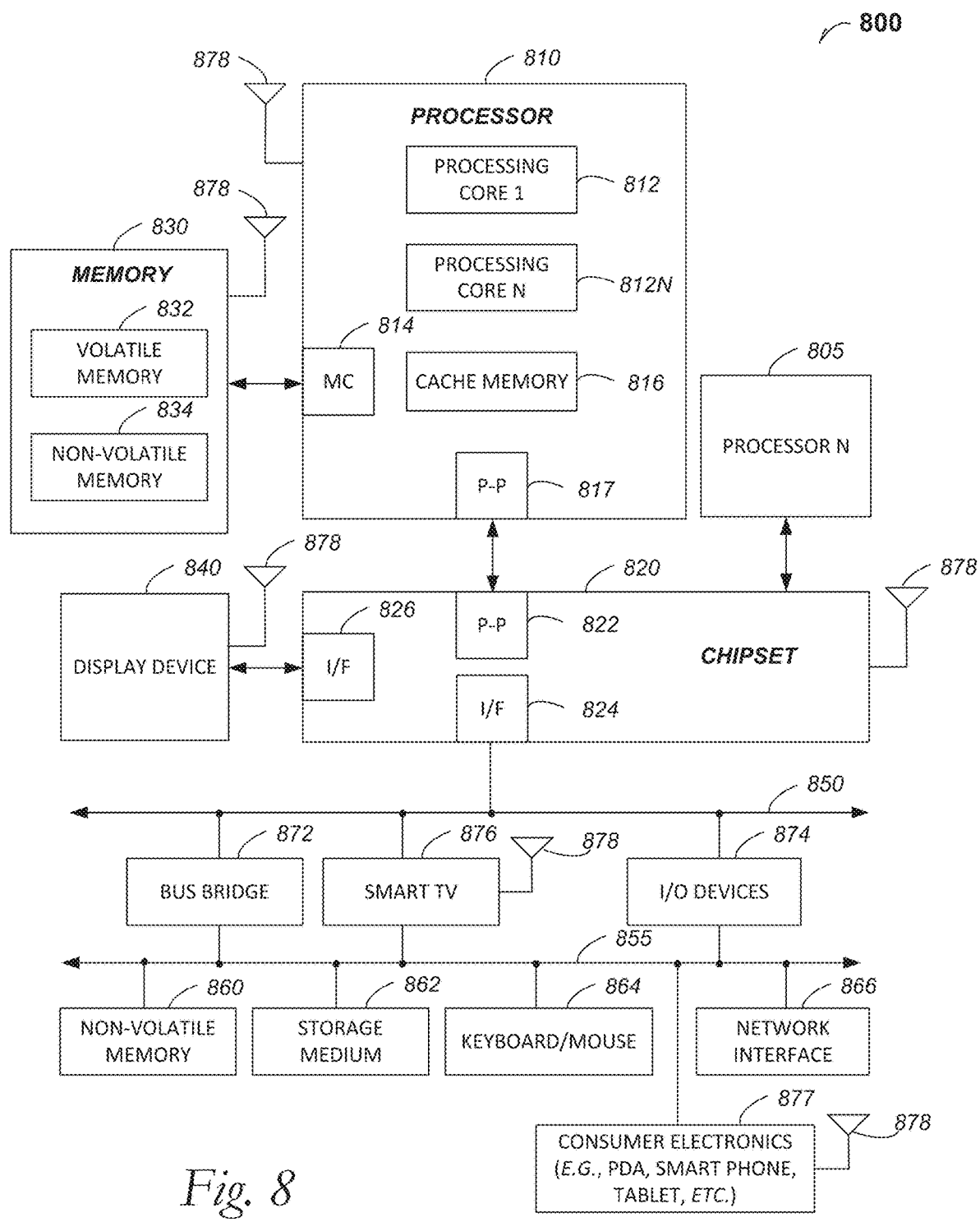
FIG. 8 is included to show an example of a higher-level device application for the disclosed embodiments.

FIG. 8 is included to show an example of a higher-level device application for the disclosed embodiments. The modulated-trace-suspending landing pad embodiments may be found in several parts of a computing system. In an embodiment, the modulated-trace-suspending landing pad embodiments can be part of a communications apparatus such as is affixed to a cellular communications tower. In an embodiment, a computing system 800 includes, but is not limited to, a desktop computer. In an embodiment, a computing system 800 includes, but is not limited to a laptop computer. In an embodiment, a computing system 800 includes, but is not limited to a tablet. In an embodiment, a computing system 800 includes, but is not limited to a notebook computer. In an embodiment, a computing system 800 includes, but is not limited to a personal digital assistant (PDA). In an embodiment, a computing system 800 includes, but is not limited to a server. In an embodiment, a computing system 800 includes, but is not limited to a workstation. In an embodiment, a computing system 800 includes, but is not limited to a cellular telephone. In an embodiment, a computing system 800 includes, but is not limited to a mobile computing device. In an embodiment, a computing system 800 includes, but is not limited to a smart phone. In an embodiment, a system 800 includes, but is not limited to an internet appliance. Other types of computing devices may be configured with the microelectronic device that includes modulated-trace-suspending landing pad embodiments.

In an embodiment, the processor 810 has one or more processing cores 812 and 812N, where 812N represents the Nth processor core inside processor 810 where N is a positive integer. In an embodiment, the electronic device system 800 using a modulated-trace-suspending landing pad embodiment that includes multiple processors including 810 and 805, where the processor 805 has logic similar or identical to the logic of the processor 810. In an embodiment, the processing core 812 includes, but is not limited to, pre-fetch logic to fetch instructions, decode logic to decode the instructions, execution logic to execute instructions and the like. In an embodiment, the processor 810 has a cache memory 816 to cache at least one of instructions and data for the modulated-trace-suspending landing pad element on an integrated-circuit package substrate in the system 800. The cache memory 816 may be organized into a hierarchal structure including one or more levels of cache memory.

In an embodiment, the processor 810 includes a memory controller 814, which is operable to perform functions that enable the processor 810 to access and communicate with memory 830 that includes at least one of a volatile memory 832 and a non-volatile memory 834. In an embodiment, the processor 810 is coupled with memory 830 and chipset 820. In an embodiment, the chipset 820 is part of a modulated-trace-suspending landing pad embodiment depicted in FIG. 1. The processor 810 may also be coupled to a wireless antenna 878 to communicate with any device configured to at least one of transmit and receive wireless signals. In an embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 832 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 834 includes, but is not limited to, flash memory, phase change memory (PCM), read-only memory (ROM), electrically erasable programmable read-only memory (EEPROM), or any other type of non-volatile memory device.

The memory 830 stores information and instructions to be executed by the processor 810. In an embodiment, the memory 830 may also store temporary variables or other intermediate information while the processor 810 is executing instructions. In the illustrated embodiment, the chipset 820 connects with processor 810 via Point-to-Point (PtP or P-P) interfaces 817 and 822. Either of these PtP embodiments may be achieved using a modulated-trace-suspending landing pad embodiment as set forth in this disclosure. The chipset 820 enables the processor 810 to connect to other elements in a modulated-trace-suspending landing pad embodiment in a system 800. In an embodiment, interfaces 817 and 822 operate in accordance with a PtP communication protocol such as the Intel® QuickPath Interconnect (QPI) or the like. In other embodiments, a different interconnect may be used.

In an embodiment, the chipset 820 is operable to communicate with the processor 810, 805N, the display device 840, and other devices 872, 876, 874, 860, 862, 864, 866, 877, etc. The chipset 820 may also be coupled to a wireless antenna 878 to communicate with any device configured to at least do one of transmit and receive wireless signals.

The chipset 820 connects to the display device 840 via the interface 826. The display 840 may be, for example, a liquid crystal display (LCD), a plasma display, cathode ray tube (CRT) display, or any other form of visual display device. In an embodiment, the processor 810 and the chipset 820 are merged into a modulated-trace-suspending landing pad embodiment in a system. Additionally, the chipset 820 connects to one or more buses 850 and 855 that interconnect various elements 874, 860, 862, 864, and 866. Buses 850 and 855 may be interconnected together via a bus bridge 872 such as at least one modulated-trace-suspending landing pad embodiment. In an embodiment, the chipset 820, via interface 824, couples with a non-volatile memory 860, a mass storage device(s) 862, a keyboard/mouse 864, a network interface 866, smart TV 876, and the consumer electronics 877, etc.

In an embodiment, the mass storage device 862 includes, but is not limited to, a solid-state drive, a hard disk drive, a universal serial bus flash memory drive, or any other form of computer data storage medium. In one embodiment, the network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the modulated-trace-suspending landing pad embodiments in a computing system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into the processor core 812.

To illustrate the modulated-trace-suspending landing pad embodiments and methods disclosed herein, a non-limiting list of examples is provided herein:

Example 1 is a signal trace in an integrated-circuit package substrate, comprising: a landing pad extending over a recess of an integrated-circuit package substrate; a trace first portion on a surface of the integrated-circuit package substrate, wherein the trace first portion has a first cross-sectional form factor, a trace second portion contacting and continuing from the trace first portion, wherein the trace second portion has a second cross-sectional form factor that is different from the trace first portion first cross-sectional form factor; and a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad.

In Example 2, the subject matter of Example 1 optionally includes wherein the recess is filled with non-electrically conductive dielectric material.

In Example 3, the subject matter of any one or more of Examples 1-2 optionally include a post portion continuing and contacting the trace subsequent portion, wherein the post portion contacts the landing pad.

In Example 4, the subject matter of any one or more of Examples 1-3 optionally include wherein the trace second portion cross-sectional form factor has the same Z-height of the trace first portion cross-sectional form factor, and wherein the trace second portion cross-sectional form factor is modulated to have a wider X-Y width than the trace first portion.

In Example 5, the subject matter of any one or more of Examples 1-4 optionally include wherein the trace second portion cross-sectional form factor, begins at a circumference boundary of the recess.

In Example 6, the subject matter of any one or more of Examples 1-5 optionally include wherein the trace second portion cross-sectional form factor, begins at a circumference boundary of the recess, and wherein the trace subsequent portion begins even with a perimeter boundary of the landing pad.

In Example 7, the subject matter of any one or more of Examples 1-6 optionally include wherein the trace second portion cross-sectional form factor, begins at a circumference boundary of the recess, wherein the trace subsequent portion begins even with a perimeter boundary of the landing pad.

In Example 8, the subject matter of any one or more of Examples 1-7 optionally include wherein the trace second portion cross-sectional form factor, begins at a circumference boundary of the recess, wherein the trace subsequent portion begins even with a perimeter boundary of the landing pad, and wherein the trace first portion cross-section form factor and the trace subsequent portion cross-section form factor are the same.

In Example 9, the subject matter of any one or more of Examples 1-8 optionally include wherein the trace second portion cross-sectional form factor has an integral metal-grain structure that transitions from the trace first portion cross-sectional form factor.

In Example 10, the subject matter of any one or more of Examples 1-9 optionally include wherein the trace second portion cross-sectional form factor has an integral metal-grain structure that transitions from the trace first portion cross-sectional form factor, and wherein the trace second portion cross-sectional form factor has an integral metal-grain structure that transitions from the trace second portion cross-sectional form factor to the trace subsequent portion cross-sectional form factor.

In Example 11, the subject matter of any one or more of Examples 1-10 optionally include ground-stitching structures that at least partially surround the recess, wherein the ground-stitching structures contact at least one common (Vss) source structure in the integrated-circuit package substrate.

In Example 12, the subject matter of any one or more of Examples 1-11 optionally include wherein the recess is a first recess with a first characteristic dimension and first characteristic form factor, further including a subsequent recess within the first recess, wherein the subsequent recess is at least partially overshadowed by the landing pad.

In Example 13, the subject matter of any one or more of Examples 1-12 optionally include wherein the recess is a first recess with a first characteristic dimension and first characteristic form factor, further including a subsequent recess within the first recess, wherein the subsequent recess is at least partially overshadowed by the landing pad, wherein the landing pad has a characteristic diameter, and wherein the subsequent recess has a characteristic diameter that is less than or equal to the landing-pad characteristic diameter.

Example 14 is an integrated-circuit package substrate, comprising: a signal trace in an integrated-circuit package substrate; a landing pad extending over a recess of the integrated-circuit package substrate, wherein the signal trace includes: a trace first portion on a surface of the integrated-circuit package substrate, wherein the trace first portion has a first cross-sectional form factor; a trace second portion contacting and continuing from the trace first portion, wherein the trace second portion has a second cross-sectional form factor that is modulated and different from the trace first portion first cross-sectional form factor, wherein the trace second portion cross-sectional form factor has the same Z-height of the trace first portion cross-sectional form factor, and wherein the trace second portion cross-sectional form factor is modulated to have a wider X-Y width than the trace first portion; a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad; and a post portion continuing and contacting the trace subsequent portion, wherein the post portion contacts the landing pad.

In Example 15, the subject matter of Example 14 optionally includes wherein the recess is filled with non-electrically conductive dielectric material.

In Example 16, the subject matter of any one or more of Examples 14-15 optionally include wherein the trace second portion cross-sectional form factor, begins at a circumference boundary of the recess, and wherein the trace subsequent portion begins even with a perimeter boundary of the landing pad.

In Example 17, the subject matter of any one or more of Examples 14-16 optionally include wherein the trace second portion cross-sectional form factor, begins at a circumference boundary of the recess, wherein the trace subsequent portion begins even with a perimeter boundary of the landing pad, and wherein the trace first portion cross-section form factor and the trace subsequent portion cross-section form factor are the same.

In Example 18, the subject matter of any one or more of Examples 14-17 optionally include wherein the recess is a first recess with a first characteristic dimension and first characteristic form factor, further including a subsequent recess within the first recess, wherein the subsequent recess is at least partially overshadowed by the landing pad.

In Example 19, the subject matter of any one or more of Examples 14-18 optionally include wherein the recess is a first recess with a first characteristic dimension and first characteristic form factor, further including a subsequent recess within the first recess, wherein the subsequent recess is at least partially overshadowed by the landing pad, wherein the landing pad has a characteristic diameter, and wherein the subsequent recess has a characteristic diameter that is less than or equal to the landing-pad characteristic diameter.

In Example 20, the subject matter of Example 19 optionally includes wherein the subsequent recess is filled with non-electrically conductive dielectric material.

In Example 21, the subject matter of any one or more of Examples 14-20 optionally include an integrated-circuit die coupled to the landing pad.

Example 22 is a computing system, comprising: an integrated-circuit die on a die side of an integrated-circuit package substrate, wherein the integrated-circuit die contacts a landing pad in a recess from the die side; a signal trace supporting a landing pad in the integrated-circuit package substrate, wherein the landing pad extends over the recess; wherein the signal trace includes: a trace first portion on a surface of the integrated-circuit package substrate, wherein the trace first portion has a first cross-sectional form factor; a trace second portion contacting and continuing from the trace first portion, wherein the trace second portion has a second cross-sectional form factor that is modulated and different from the trace first portion first cross-sectional form factor, wherein the trace second portion cross-sectional form factor has the same Z-height of the trace first portion cross-sectional form factor, and wherein the trace second portion cross-sectional form factor is modulated to have a wider X-Y width than the trace first portion; and a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad; and a post portion continuing and contacting the trace subsequent portion, wherein the post portion contacts the landing pad.

In Example 23, the subject matter of Example 22 optionally includes wherein the integrated-circuit die is an integrated-circuit first die, further including an integrated-circuit subsequent die also on the die side of the integrated-circuit package substrate, and wherein the integrated-circuit first die and the integrated-circuit subsequent die are part of a chipset in a multi-chip module.

In Example 24, the subject matter of any one or more of Examples 22-23 optionally include a board coupled to the integrated-circuit package substrate from a land side.

In Example 25, the subject matter of any one or more of Examples 22-24 optionally include wherein the trace second portion cross-sectional form factor, begins at a circumference boundary of the recess, and wherein the trace subsequent portion begins even with a perimeter boundary of the landing pad.

In Example 26, the subject matter of any one or more of Examples 22-25 optionally include wherein the trace second portion cross-sectional form factor, begins at a circumference boundary of the recess, wherein the trace subsequent portion begins even with a perimeter boundary of the landing pad, and wherein the trace first portion cross-section form factor and the trace subsequent portion cross-section form factor are the same.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A signal trace in an integrated-circuit package substrate, comprising:
   a landing pad extending over a recess of an integrated-circuit package substrate:
   a trace first portion on a surface of the integrated-circuit package substrate, wherein the trace first portion has a first cross-sectional form factor,
   a trace second portion contacting and continuing from the trace first portion, wherein the trace second portion has a second cross-sectional form factor that is different from the trace first portion first cross-sectional form factor; and
   a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad, wherein the trace second portion cross-sectional form factor has an integral metal-grain structure that transitions from the trace first portion cross-sectional form factor, and wherein the trace second portion cross-sectional form factor has an integral metal-grain structure that transitions from the trace second portion cross-sectional form factor to the trace subsequent portion cross-sectional form factor.

2. The signal trace in the integrated-circuit package substrate of claim 1,
   wherein the recess is filled with non-electrically conductive dielectric material.

3. The signal trace in the integrated-circuit package substrate of claim 1, further including:
   a post portion continuing and contacting the trace subsequent portion, wherein the post portion contacts the landing pad.

4. The signal trace in the integrated-circuit package substrate of claim 1, wherein the trace second portion cross-sectional form factor has the same Z-height of the trace first portion cross-sectional form factor, and wherein the trace second portion cross-sectional form factor is modulated to have a wider X-Y width than the trace first portion.

5. The signal trace in the integrated-circuit package substrate of claim 1, wherein the trace second portion cross-sectional form factor, begins at a circumference boundary of the recess.

6. The signal trace in the integrated-circuit package substrate of claim 1, wherein the trace second portion cross-sectional form factor, begins at a circumference boundary of the recess, and wherein the trace subsequent portion begins even with a perimeter boundary of the landing pad.

7. The signal trace in the integrated-circuit package substrate of claim 1, wherein the trace second portion cross-sectional form factor, begins at a circumference boundary of the recess, wherein the trace subsequent portion begins even with a perimeter boundary of the landing pad.

8. The signal trace in the integrated-circuit package substrate of claim 1, wherein the trace second portion cross-sectional form factor, begins at a circumference boundary of the recess, wherein the trace subsequent portion begins even with a perimeter boundary of the landing pad, and wherein the trace first portion cross-section form factor and the trace subsequent portion cross-section form factor are the same.

9. The signal trace in the integrated-circuit package substrate of claim 1, wherein the trace second portion cross-sectional form factor has an integral metal-grain structure that transitions from the trace first portion cross-sectional form factor.

10. A signal trace in an integrated-circuit package substrate, comprising:
    a landing pad extending over a recess of an integrated-circuit package substrate:
    a trace first portion on a surface of the integrated-circuit package substrate, wherein the trace first portion has a first cross-sectional form factor,
    a trace second portion contacting and continuing from the trace first portion, wherein the trace second portion has a second cross-sectional form factor that is different from the trace first portion first cross-sectional form factor; and
    a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad, further including:
    ground-stitching structures that at least partially surround the recess, wherein the ground-stitching structures contact at least one common (Vss) source structure in the integrated-circuit package substrate.

11. A signal trace in an integrated-circuit package substrate, comprising:
    a landing pad extending over a recess of an integrated-circuit package substrate:
    a trace first portion on a surface of the integrated-circuit package substrate, wherein the trace first portion has a first cross-sectional form factor,
    a trace second portion contacting and continuing from the trace first portion, wherein the trace second portion has a second cross-sectional form factor that is different from the trace first portion first cross-sectional form factor; and a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad, wherein the recess is a first recess with a first characteristic dimension and first characteristic form factor, further including a subsequent recess within the first recess, wherein the subsequent recess is at least partially overshadowed by the landing pad.

12. A signal trace in an integrated-circuit package substrate, comprising:
a landing pad extending over a recess of an integrated-circuit package substrate:
a trace first portion on a surface of the integrated-circuit package substrate, wherein the trace first portion has a first cross-sectional form factor,
a trace second portion contacting and continuing from the trace first portion, wherein the trace second portion has a second cross-sectional form factor that is different from the trace first portion first cross-sectional form factor; and
a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad, wherein the recess is a first recess with a first characteristic dimension and first characteristic form factor, further including a subsequent recess within the first recess, wherein the subsequent recess is at least partially overshadowed by the landing pad, wherein the landing pad has a characteristic diameter, and wherein the subsequent recess has a characteristic diameter that is less than or equal to the landing-pad characteristic diameter.

13. An integrated-circuit package substrate, comprising:
a signal trace in an integrated-circuit package substrate:
a landing pad extending over a recess of the integrated-circuit package substrate, wherein the signal trace includes:
a trace first portion on a surface of the integrated-circuit package substrate, wherein the trace first portion has a first cross-sectional form factor;
a trace second portion contacting and continuing from the trace first portion, wherein the trace second portion has a second cross-sectional form factor that is modulated and different from the trace first portion first cross-sectional form factor, wherein the trace second portion cross-sectional form factor has the same Z-height of the trace first portion cross-sectional form factor, and wherein the trace second portion cross-sectional form factor is modulated to have a wider X-Y width than the trace first portion;
a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad; and
a post portion continuing and contacting the trace subsequent portion, wherein the post portion contacts the landing pad, wherein the recess is a first recess with a first characteristic dimension and first characteristic form factor, further including a subsequent recess within the first recess, wherein the subsequent recess is at least partially overshadowed by the landing pad.

14. The integrated-circuit package substrate of claim 13, further including an integrated-circuit die coupled to the landing pad.

15. An integrated-circuit package substrate, comprising:
a signal trace in an integrated-circuit package substrate:
a landing pad extending over a recess of the integrated-circuit package substrate, wherein the signal trace includes:
a trace first portion on a surface of the integrated-circuit package substrate, wherein the trace first portion has a first cross-sectional form factor,
a trace second portion contacting and continuing from the trace first portion, wherein the trace second portion has a second cross-sectional form factor that is modulated and different from the trace first portion first cross-sectional form factor, wherein the trace second portion cross-sectional form factor has the same Z-height of the trace first portion cross-sectional form factor, and wherein the trace second portion cross-sectional form factor is modulated to have a wider X-Y width than the trace first portion;
a trace subsequent portion continuing from the trace second portion, wherein the trace subsequent portion has a subsequent cross-sectional form factor that is different from the trace second portion cross-sectional form factor, wherein the trace subsequent portion is closest to the landing pad compared to the trace first and trace second portions, and wherein the trace subsequent portion, supports the landing pad; and
a post portion continuing and contacting the trace subsequent portion, wherein the post portion contacts the landing pad, wherein the recess is a first recess with a first characteristic dimension and first characteristic form factor, further including a subsequent recess within the first recess, wherein the subsequent recess is at least partially overshadowed by the landing pad, wherein the landing pad has a characteristic diameter, and wherein the subsequent recess has a characteristic diameter that is less than or equal to the landing-pad characteristic diameter.

16. The integrated-circuit package substrate of claim 15, wherein the subsequent recess is filled with non-electrically conductive dielectric material.

* * * * *